United States Patent
Bahl et al.

(10) Patent No.: US 10,094,863 B2
(45) Date of Patent: Oct. 9, 2018

(54) HIGH-RESOLUTION POWER ELECTRONICS MEASUREMENTS

(71) Applicant: Texas Instruments Incorporated, Dallas, TX (US)

(72) Inventors: Sandeep R. Bahl, Palo Alto, CA (US); Grant L. Smith, Fremont, CA (US); Daniel Ruiz Flores, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 49 days.

(21) Appl. No.: 15/058,444

(22) Filed: Mar. 2, 2016

(65) Prior Publication Data

US 2017/0254842 A1  Sep. 7, 2017

(51) Int. Cl.
| | |
|---|---|
| *G01R 27/02* | (2006.01) |
| *G01R 15/04* | (2006.01) |
| *G01R 19/00* | (2006.01) |
| *G01R 31/26* | (2014.01) |

(52) U.S. Cl.
CPC ............ *G01R 27/02* (2013.01); *G01R 15/04* (2013.01); *G01R 19/0084* (2013.01); *G01R 31/2621* (2013.01); *G01R 31/2639* (2013.01); *G01R 31/2617* (2013.01)

(58) Field of Classification Search
CPC . G01R 31/26–31/2628; G01R 31/2642; G01R 31/2644; G01R 1/06766
See application file for complete search history.

(56) References Cited

U.S. PATENT DOCUMENTS

| | | | |
|---|---|---|---|
| 2,883,619 A | 2/1956 | Kobbe et al. | |
| 6,127,746 A * | 10/2000 | Clemente | G01R 19/12 |
| | | | 307/131 |
| 7,960,997 B2 | 6/2011 | Williams | |
| 2004/0178817 A1* | 9/2004 | Pan | G01R 31/2621 |
| | | | 324/762.09 |
| 2006/0145708 A1* | 7/2006 | Saito | G01R 31/2601 |
| | | | 324/713 |

(Continued)

OTHER PUBLICATIONS

Badawi et al., "A New Method for Dynamic Ron Extraction of GaN", PCIM Europe, May 19-21, 2015, Nuremberg, Germany, pp. 1010-1015.

(Continued)

*Primary Examiner* — Huy Q Phan
*Assistant Examiner* — David Frederiksen
(74) *Attorney, Agent, or Firm* — William B. Kempler; Charles A. Brill; Frank D. Cimino

(57) ABSTRACT

Disclosed examples include systems to determine an on-state impedance of a high voltage transistor, and measurement circuits to measure the drain voltage of a drain terminal of the high voltage transistor during switching, including an attenuator circuit to generate an attenuator output signal representing a voltage across the high voltage transistor when the high voltage transistor is turned on, and a differential amplifier to provide an amplified sense voltage signal according to the attenuator output signal. The attenuator circuit includes a clamp transistor coupled with the drain terminal of the high voltage transistor to provide a sense signal to a first internal node, a resistive voltage divider circuit to provide the attenuator output signal based on the sense signal, and a first clamp circuit to limit the sense signal voltage when the high voltage transistor is turned off.

25 Claims, 8 Drawing Sheets

(56) References Cited

U.S. PATENT DOCUMENTS

| | | | | |
|---|---|---|---|---|
| 2007/0013407 | A1* | 1/2007 | Okawa | G01R 27/28 324/762.09 |
| 2008/0174335 | A1* | 7/2008 | Maekawa | G01R 31/2621 324/762.09 |
| 2008/0191709 | A1* | 8/2008 | Mehta | G01R 31/2603 324/601 |
| 2008/0309355 | A1* | 12/2008 | Nozaki | G01R 1/06766 324/754.01 |
| 2009/0102504 | A1* | 4/2009 | Voigtlaender | G01R 31/2621 324/762.09 |
| 2010/0127331 | A1* | 5/2010 | Ratnakumar | G06F 17/5063 257/365 |
| 2010/0237928 | A1 | 9/2010 | Miyazawa | |
| 2011/0163307 | A1* | 7/2011 | Lin | H01L 21/02422 257/43 |
| 2011/0248702 | A1 | 10/2011 | Kume | |
| 2013/0093411 | A1* | 4/2013 | Koeppl | G01K 7/01 324/105 |
| 2013/0181723 | A1* | 7/2013 | Mauder | G01R 19/0092 324/601 |
| 2014/0139206 | A1* | 5/2014 | Hirose | G01R 31/2621 324/132 |
| 2014/0334051 | A1 | 11/2014 | Yagyu et al. | |
| 2015/0070045 | A1* | 3/2015 | Fang | G01R 31/2621 324/762.01 |

OTHER PUBLICATIONS

Lu et al., "Extraction of Dynamic On-Resistance in GaN Transistors Under Soft- and Hard-Switchng Conditions", IEEE Compound Semiconductor IC Symposium, 2011, 4 pgs.

Texas Instruments, "VCA824 Ultra-Wideband, >40-dB Gain Adjust Range, Linear in V/V Variable Gain Amplifier", VCA824, SBOS394D, Nov. 2007, Revised Jan. 2016, 41 pgs.

Smith, "Tips and Tricks for High-Speed, High-Current Measurement", How2Power Today, Your Power Design Newsletter, Jan. 2016, 7 pgs.

Smith, "Tips and Tricks for High-Speed, High-Voltage Measurement", Analog Applications Journal (Industrial), Texas Instruments, AAJ 2Q 2015, 16 pgs.

Siemens, "Silicon Schottky Diode", BAT 15-03W, Semiconductor Group, Mar. 19, 1996, 5 pgs.

IXYS Corporation, Polar Power MOSFETs, DS100201A, Mar. 2013, 4 pgs.

Suh et al., "Low-Cost Solution for Wafer Level High Voltage Dynamic RON Characterization", Texas Instruments, TI Tech Journal, vol. 1, No. 3, Oct. 2015, pp. 82-86.

International Rectifier, "SOT-23 Current Sensing IC", IR25750LPBF, www.irf.com, Jan. 15, 2015, pp. 1-17.

Search Report for PCT Application No. PCT/US17/20535, dated Jun. 8, 2017 (1 page).

* cited by examiner

HIGH-RESOLUTION POWER ELECTRONICS MEASUREMENTS

TECHNICAL FIELD

The present disclosure relates generally to measuring transistor operating characteristics and more particularly to systems and circuits to measure voltages across high-voltage transistors during switching to determine on-state impedances during switching.

BACKGROUND

Gallium nitride (GaN) and aluminum gallium nitride (AlGaN) high electron mobility transistors (HEMTs), silicon carbide (SiC) and other high voltage transistors are becoming popular for high voltage power conversion applications, due to high breakdown voltages as well as low on state resistance and reduced conduction losses. Electron trapping in AlGaN/GaN HEMTs causes current collapse and increased drain-source on-state resistance (RDSON) in certain dynamic conditions. However, measuring the dynamic RDSON performance of HEMTs is difficult. Measurements by semiconductor testers do not simulate the true device conditions in actual power electronics circuits. For example, switching transistors in typical power converters undergo a hard-switching transition before turning on. The transistors also switch at high frequencies, typically hundreds of KHz, and thereby the measurement needs to reflect the RDSON value within a very short time after turn on, such as a microsecond in some instances. These conditions are very difficult to replicate in semiconductor testers, particularly for testing multiple devices. Improved circuits and techniques for measurement of the dynamic RDSON under the operating conditions of real power electronics circuits are therefore desired, particularly for HEMTs such as high-voltage AlGaN/GaN and SiC transistors. One approach is to measure the on-state drain-source voltage and the corresponding transistor current during dynamic operation. However, the drain voltage in high voltage applications varies between hundreds of volts in the off state and millivolts in the on state. As a result, direct measurement using ordinary oscilloscope voltage probes can saturate the oscilloscope channel when the high-voltage transistor is off. Moreover, the measured drain-source transistor voltage cannot be accurately measured by conventional high voltage oscilloscope probes due to their high divide ratios, typically 100×, resulting in signals too small for the oscilloscope to resolve when the transistor is on. Conventional voltage clamping circuitry can be used to limit the maximum voltage seen by the oscilloscope, but these circuits introduce large RC time constants and thus do not provide sufficiently short settling times to accurately assess dynamic drain-source voltage characteristics and hence dynamic RDSON for high-voltage AlGaN/GaN and SiC transistors in real-world conditions.

SUMMARY

Disclosed examples include systems to determine high-voltage transistor RDSON, and measurement circuits to measure the transistor drain voltage during switching. The circuitry facilitates high-resolution measurement of dynamic characteristics of drain-source voltages of AlGaN/GaN and SiC devices or other high voltage transistors, and the apparatus and techniques can be used in hard-switching and other high-voltage circuits including a high voltage transistor device under test (DUT) undergoing switching. Systems are disclosed for determining the RDSON of a high voltage transistor, including a drive circuit to turn the high-voltage transistor on and off in a high voltage circuit, a subjecting circuit to subject the high-voltage transistor to a hard-switching transition, and a current sense circuit to provide a signal representing a current flowing through the high-voltage transistor during switching. The system includes a measurement circuit with attenuator and differential amplifier circuitry to provide an amplified sense voltage signal representing the voltage of the high-voltage transistor during switching, and a high-speed analog signal digitizer, such as an oscilloscope, to provide an on-state impedance value based on the slope of the current sense signal and the slope of the amplified sense voltage signal.

The measurement circuit includes an attenuator circuit to generate an attenuator output signal representing a voltage across the high voltage transistor when the high voltage transistor is turned on, and a differential amplifier to provide an amplified sense voltage signal according to the attenuator output signal. The attenuator circuit includes a clamp transistor coupled with the high voltage transistor to provide a sense signal to a resistive voltage divider circuit to provide the attenuator output signal, and a first clamp circuit to limit the sense signal voltage when the high voltage transistor is turned off. A second clamp circuit in certain embodiments conditions the attenuator output signal, including a low capacitance diode to limit the voltage of the attenuator output node, and a compensation capacitor can be included to compensate a capacitance of the differential amplifier input for fast signal settling time. The resistive voltage divider circuit is adjustable in certain examples to facilitate measurement of a wide dynamic range of drain-source voltage and other parameters associated with the DUT RDSON.

DETAILED DESCRIPTION

Figure 1:
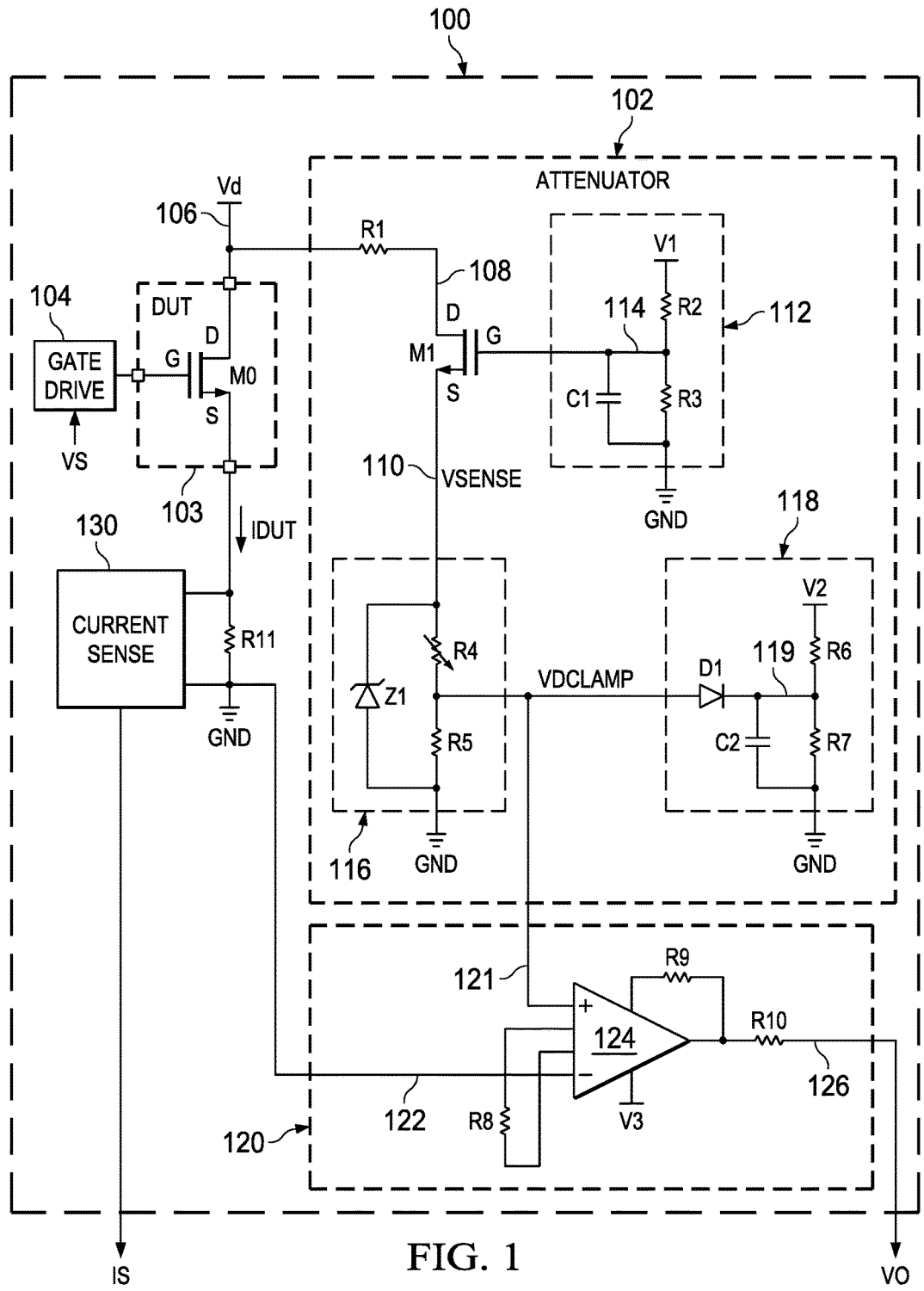
FIG. 1 is a schematic diagram illustrating a high voltage transistor device under test and a test pod including an attenuator circuit and a differential amplifier circuit.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

FIG. 1 shows a measurement circuit 100 including an attenuator circuit 102 and an amplifier circuit 120 to measure a drain voltage of a high voltage transistor M0. The attenuator circuit 102 generates an attenuator output or drain voltage clamp signal VDCLAMP at an attenuator output node 121. The attenuator output signal VDCLAMP represents the voltage across the transistor M0 when M0 is turned on, and is provided as an input to the amplifier circuit 120. The transistor M0 can be any suitable high-voltage transistor, such as a gallium nitride, aluminum gallium nitride, silicon, or silicon carbide high voltage transistor. As seen in FIG. 1, the transistor M0 includes a drain terminal (D) connected via line 106 to a high voltage Vd through a subjecting circuit (not shown in FIG. 1), a source terminal (S) coupled with a constant voltage node GND through a current sense resistor R11 for measurement of a DUT current IDUT (e.g., the source current of M0). In one example, the current sense resistor R11 is a very low impedance device, such as 0.1 ohms. In other examples, the current IDUT can be sensed using a current probe (not shown).

The DUT transistor M0 further includes a gate control terminal (G) which receives a switching control signal from a gate drive circuit 104. In a multi-DUT system application, a supervisory controller can operate the gate driver circuit 104 to provide switching operation of the DUT 103 while on-state drain voltage measurements are obtained via the measurement circuit 100 and conveyed through one or more multiplexers to a signal digitizing instrument such as an oscilloscope. In one example, the high-voltage transistor M0 is positioned as a device under test (DUT) 103 in a test fixture or pod to complete a switching or subjecting circuit, such as a high-voltage hard-switching circuit illustrated and described below in connection with FIG. 5. System applications as described below benefit from use of the measurement circuitry 100 to facilitate high-resolution low-voltage device drain voltage measurements for a number of DUTs 103 during switching. In one example, the measurement circuit 100 also includes clamp circuitry to protect against switching-induced overvoltage spikes, and facilitates fast settling time for measurements in the sub-microsecond range. The measurement circuit 100 provides signal conditioning for amplification and transmission of an amplified voltage sense signal VO through cables and multiplexers to allow a single digitizing instrument or oscilloscope to characterize RDSON according to measured on-state drain voltages of multiple DUTs 103 and according to corresponding current sense signals IS. In such a system configuration, each DUT transistor M0 is driven by a corresponding gate drive circuit 104, and each transistor current IDUT is sensed by a corresponding current sense circuit 130 to provide a corresponding current sense signal IS.

The attenuator circuit 102 includes a clamp transistor M1 with a drain or first terminal D coupled with the drain terminal 106 of the high voltage transistor M0 through a first resistor R1 to sense the drain voltage of M0. In one example, the first resistor R1 is a low resistance component, for example, 10 ohms. A second (e.g., source) terminal S of M1 provides a sense signal VSENSE to a first internal node 110 of the attenuator circuit 102. M1 includes a gate control terminal G that receives a first bias signal at an internal node 114 from a bias circuit 112 based on a first supply voltage V1. The bias circuit 112 turns the clamp transistor M1 on when the high voltage transistor M0 is turned on. The first bias circuit 112 includes a second resistor R2 coupled between V1 and the node 114 at the control terminal G of the clamp transistor M1, and a third resistor R3 coupled between the control terminal node 114 and the constant voltage node GND. The circuit 112 further includes a bias circuit capacitor C1 coupled between the node 114 and GND to reduce voltage spikes and to stabilize the voltage on the control terminal G of M1 during switching of the high voltage transistor M0. In one example, the first resistor R1 is 10 ohms to provide a slight amount of impedance between the sensed drain line 106 of the DUT 103 and the drain line 108 of the clamp transistor M1. In the illustrated example, M1 is an N-channel field effect transistor (FET) having a low gate-drain capacitance Cgd, which in combination with the bias circuit capacitor C1 provides stable sensing through the drain-source channel of M1 even in the presence of high voltage transients at the drain line as M0 is switching. In one example, M1 is a IXTY02N120P 1200 V enhancement mode FET with a rated drain current of 200 mA, maximum rated voltage $V_{DSS}$ of 1200 V, and an RDSON of 75 ohms, although other suitable clamp transistors can be used, preferably having low capacitance between the drain D and both gate G and source S terminals. In this example, moreover, R2 is 1 kohm, R3 is 10 kohm and C1 is 1 μF for a first supply voltage V1 of 12 V, although other suitable component values can be used in other embodiments.

The attenuator circuit 102 also includes a first voltage divider circuit 116 formed by resistors R4 and R5 connected in series with one another between the first internal node 110 and GND. The voltage divider resistors R4 and R5 are connected to one another at an attenuator output node 121 to provide the attenuator output signal VDCLAMP based on the sense signal VSENSE from the clamp transistor M1. In one example, R4 and R5 are preferably matched resistors having values of 10 kohms to provide a low current attenuator output signal VDCLAMP, with good thermal matching between the resistors R4, R5. In one example, R4 is adjustable. R4 in such embodiments can be implemented as a trim pot, or the resistance R4 may be implemented as a set of multiple switchable resistors configured in any suitable series, parallel and/or a combination series/parallel configurations to implement a switch selectable adjustable resistance R4. An adjustable resistance R4 in certain embodiments can be used to provide a tunable gain for the attenuation circuit 102, alone or in combination with an adjustable gain of the amplifier circuit 120 as discussed below, to support a wide dynamic range of measurable parameters of the DUT 103 including without limitation RDSON.

The attenuator circuit 102 also includes a first clamp circuit to limit the voltage of the resistive voltage divider circuit R4, R5 between the first internal node 110 and GND when the high voltage transistor M0 is turned off. In one example, the first clamp includes a 12 V Zener diode Z1 coupled between the first internal node 110 and GND. In operation, Z1 increases the reliability of the attenuator circuit 102 by protecting the clamp transistor M1 against spikes on the first internal node 110 during switching operation of M0. In particular, when the voltage at the drain terminal 108 of M1 goes up in response to M0 turning off, Z1 passes any spike current to GND by clamping the voltage at the node 110 to approximately 12 V to stabilize the attenuator output signal VDCLAMP against voltage spikes coupled through the drain-source capacitance Cds of the clamp transistor M1. Z1 also improves the robustness of the attenuator circuit 102 by preventing high gate-to-source voltages from appearing across clamp transistor M1. In this regard, the voltage at the gate node 114 of M1 is biased to a voltage less than or equal to V1 (e.g., less than or equal to 12 V) by the bias circuit 112, and the nominal source voltage at the internal node 110 (VSENSE) will be the gate voltage at node 114 minus the threshold voltage (Vt) of M1 while the DUT transistor M0 is turned off, and Z1 prevents the sense voltage VSENSE from spiking above 12 V when M0 is turned off. In this manner, the voltage divider circuit 116 including the clamping Zener Z1 provides a stable attenuator output signal VDCLAMP from the attenuator output node 121 as an input signal to the amplifier circuit 120 in the presence of high voltage switching operation of the DUT M0.

The example attenuator circuit 102 in FIG. 1 also includes a second clamp circuit 118 to condition the attenuator output signal VDCLAMP. The second clamp circuit 118 in this example includes a second voltage divider circuit formed by resistors R6 and R7 connected in series with one another between a second supply voltage V2 (e.g., 5 V) and the constant voltage node GND to provide a bias voltage signal at a second internal node 119. The second clamp circuit 118 also includes a low capacitance diode D1 with an anode coupled with the attenuator output node 121, and a cathode coupled with the second internal node 119. In one example, D1 is a low capacitance BAT 15-03W silicon Schottky diode. In operation, the second clamp circuit 118 limits the voltage VDCLAMP of the attenuator output node 121. For example, when M0 is on, and currents are less than 10 Amps, the drain voltage of M0 is typically less than a few volts, and VDCLAMP is low, so the diode D1 remains reverse biased and will not conduct. Thus, during measurement of the DUT drain voltage, M0 is in the on state, and D1 does not affect the attenuation or amplification of the VDCLAMP signal. D1 is chosen to have a low capacitance value, typically less than 1 pf to improve the settling time and accuracy of the drain voltage measurement in the first microsecond after turn on.

The amplifier circuit 120 in one example includes a differential amplifier 124, with a first input (+) coupled with the attenuator output node 121 to receive the attenuator output signal VDCLAMP, and a second input (−) coupled connected to GND via line 122. In other embodiments, the (−) input into the differential amplifier 124 is coupled to the source of the DUT M0, and the shunt resistor value need not be accounted for in the RDSON measurement. The differential amplifier 124 includes an output to provide an amplified sense voltage signal VO along line 126 via an output resistor R10 representing the voltage across the high voltage transistor M0 when M0 is turned on. In one example, the output resistor R10 is a 50 ohm resistor to advantageously provide a matched output impedance for use with a 50 ohm coaxial cable as discussed further below in connection with FIGS. 3-7. The use of a differential amplifier 124 advantageously facilitates removal or mitigation of offset effects and to provide common mode noise rejection of signals due to ground inductance by providing a ground reference close to the DUT 103. In one example, the differential amplifier 124 is a Texas Instruments VCA824 ultra wideband adjustable gain fully differential amplifier having a low input capacitance to facilitate fast settling time and amplification of the attenuator output signal VDCLAMP to provide the amplified sense voltage signal VO for further processing to determine RDSON of the DUT M0. In one example, the gain of the amplifier 124 is set by a gain resistance R8. The gain of the amplifier 124 is adjustable in certain implementations through an adjustable resistor R8. The amplifier circuit 120 also includes a feedback resistor R9, and is provided with a gain adjustment bias voltage V3 in one example.

Figure 2:
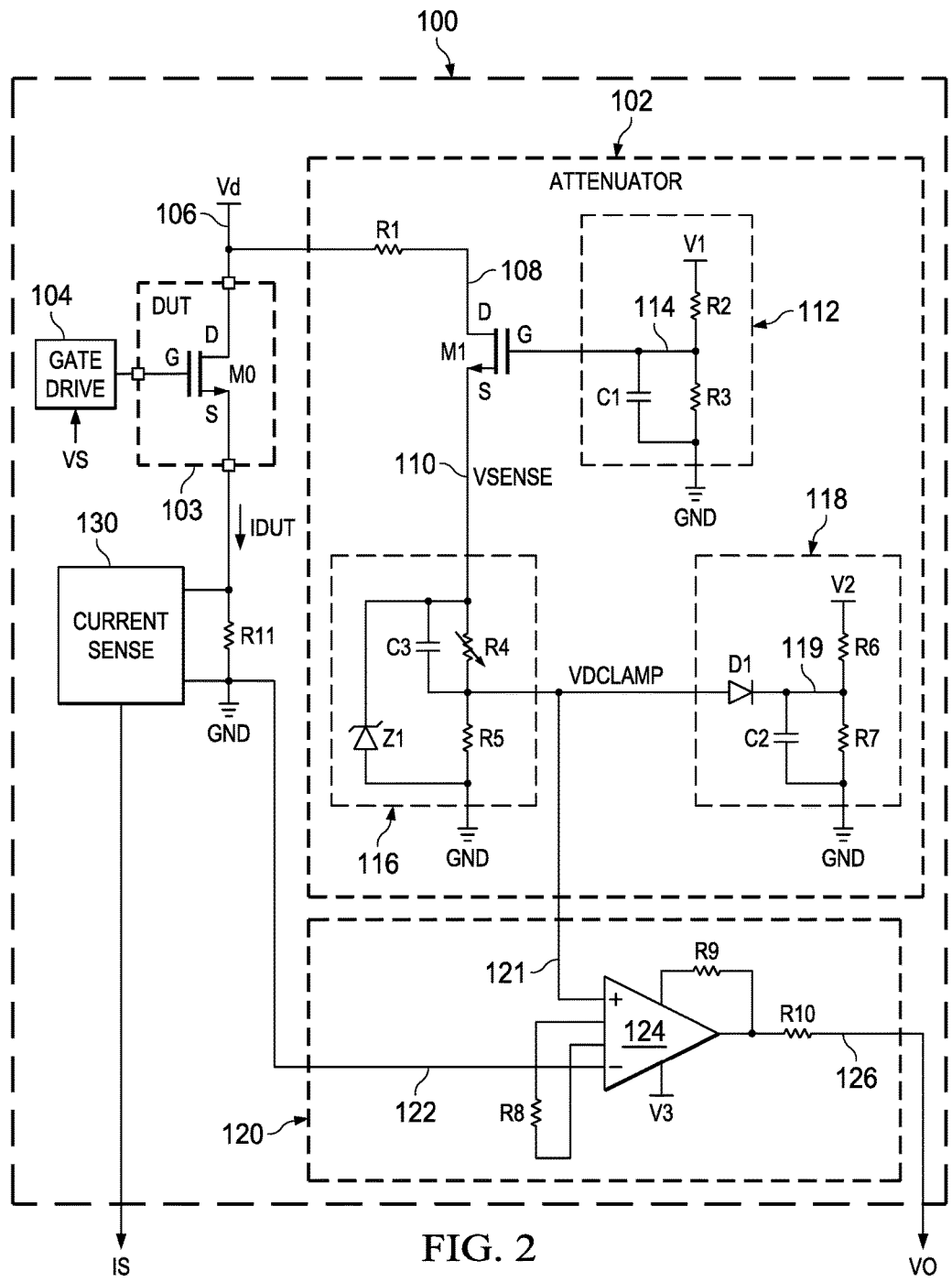
FIG. 2 is a schematic diagram of a second test by example.

Referring also to FIG. 2, another embodiment includes a compensation capacitor C3 to compensate a capacitance of the first input (+) of the differential amplifier 124. The compensation capacitor C3 includes a first terminal connected to the first internal node 110, and a second terminal connected to the attenuator output node 121. In one example, using a VCA824 differential amplifier 124, the input capacitance of the (+) input is on the order of 1 pF, and the compensation capacitor C3 is 1 pF in order to compensate the amplifier input capacitance. This effectively creates a pole to cancel the zero of the amplifier input capacitance, thereby shortening the input signal settling time and enhancing the bandwidth of the measurement system. As previously noted, the high switching rates of gallium nitride high-voltage transistors M0 is an attractive feature for power converters or other high voltage switching systems. The high bandwidth and low settling times achieved by the measurement circuitry 100 facilitates measurement of the highly dynamic operating parameters of the DUT M0, while providing protection and/or immunity against voltage spikes and noise associated with the high voltage switching operation of M0 in a high voltage system. The circuitry 100 thus presents significant advantages compared with oscilloscope probes and conventional clamping circuits to facilitate accurate characterization of the performance of the DUT M0 for production testing, life testing, and other applications.

FIGS. 3-7 illustrate application of the attenuator circuit 102 and the differential amp circuit 120 in a multiple DUT system application for test and/or measurement of multiple DUTs 103 during switching operation thereof in high voltage tests circuits, along with characterization of RDSON for the tested DUTs 103 using a slope comparison technique based on the amplified sense voltage signals Vd associated with the individual tested devices 103.

Figure 3:
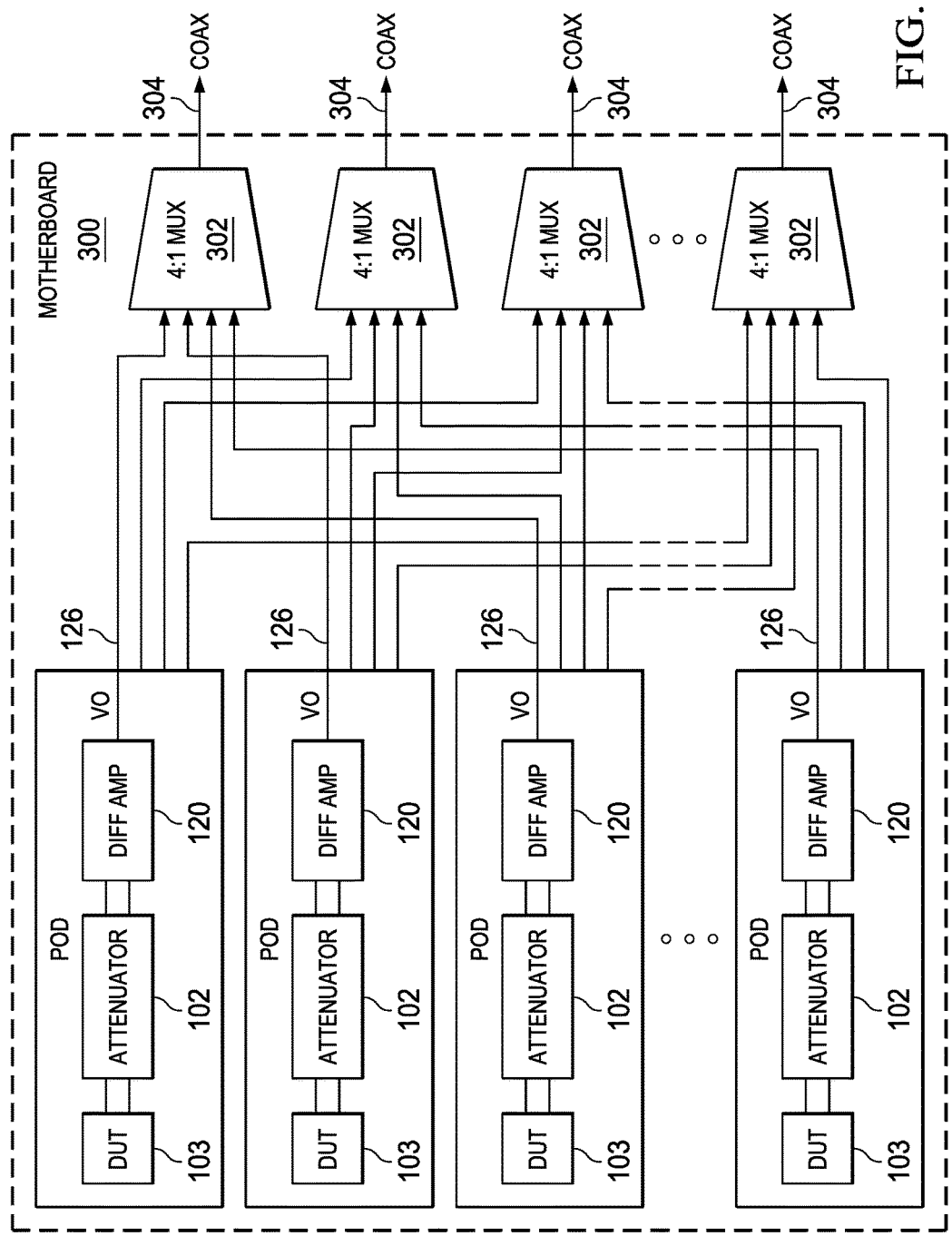
FIG. 3 is a schematic diagram of a motherboard including a plurality of test pods and multiplexer circuits.

FIG. 3 shows a motherboard 300 that can be rack-mounted along with a number of other identical motherboards 300 in a test set up to form a system for RDSON measurement of gallium nitride, aluminum gallium nitride and/or silicon carbide or silicon high-voltage transistors (e.g., FETs, HEMTs, BJTs, etc.) during switching operation and corresponding high-voltage circuits. In the example of FIG. 3, the motherboard 300 includes an integer number "M" modules or "pods", each pod constituting an integer number "N" measurement circuits e.g., 100, each with its output. In one example, there are two measurement circuits per pod used to determine RDSON, one for the drain voltage measurement, and one for the current measurement as described, and each measurement circuit uses a differential amplifier. The illustrated embodiment has one DUT 103 per pod, with the attenuated and clamped drain voltage signal output and the device current signal output. Accordingly, the illustrated pods individually include one DUT 103, one attenuator circuit 102 and one differential amplifier circuit 120 to provide a corresponding amplified sense voltage signal VO on a corresponding line 126 as shown. In the general case, each motherboard 300 has an N multiplexers 302 and each multiplexer 302 has M inputs. As a result, each motherboard will have M pods and N outputs, with each multiplexer multiplexing the same type of measurement signal from each pod. For example, the attenuated and clamped drain signals, VO from all M pods in one example are connected to one multiplexer, and the corresponding DUT sense current signals IS (from the corresponding current sense circuits 130 is shown in FIGS. 2 and 3) as output signals, are connected to another multiplexer. In the example of FIG. 3, M=4 and N=4. The multiplexers on the mother board in one example allow the coaxial outputs to be connected to the pod being sampled. Four 4:1 multiplexers are used in this example to sample not only the attenuated and clamped drain and current signals used to measure RDSON, but also to allow sampling of the drain voltage attenuated by 1000 and the gate voltage attenuated by 20, resulting in four signals per pod. In other examples, an integer number N M:1 multiplexers can be used, where M is the number of pods and N is the number of signals and coaxial outputs per pod. In one example, the motherboard accommodates 4 pods, each with four signals, so there are four 4:1 multiplexers per mother board. In the example of FIG. 3, the motherboard 300 includes a number of multiplexer circuits 302, in this example 4:1 multiplexers (MUXs), that each receive 4 input signals and provide a multiplexer output 304 to a coaxial cable (COAX, not shown).

Figure 4:
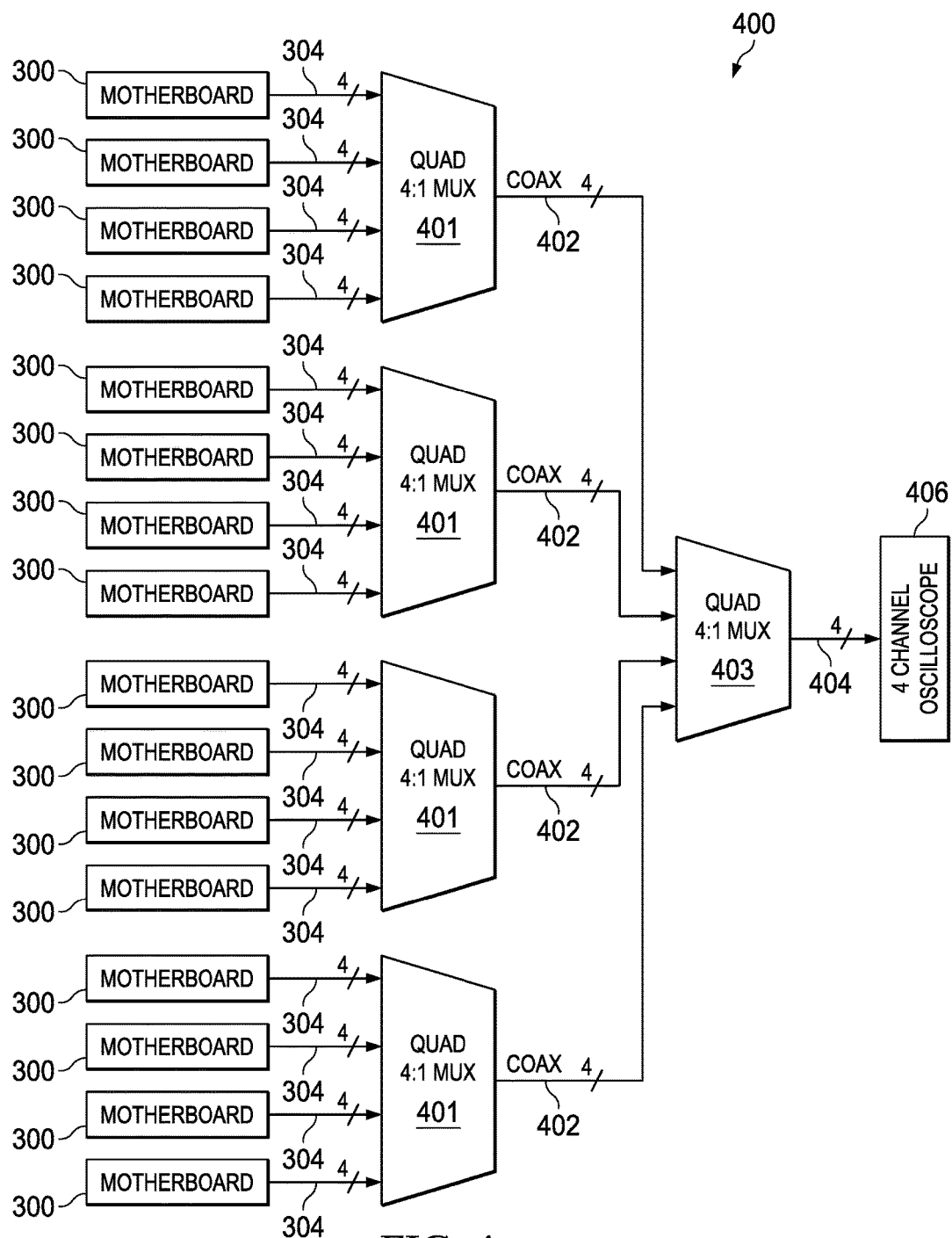
FIG. 4 is a system diagram showing a plurality of motherboards providing signals to first and second levels of multiplexers to provide input signals to an oscilloscope to analyze devices under test.

As further shown in FIG. 4, the motherboards 300 each provide the multiplexed sense voltage signals 304 using matched-length coaxial cables to a first set of N X:1 multiplexers, where X is the number of motherboards connected to each multiplexer shown as quad 4:1 multiplexers 401. In this example, four quad 4:1 multiplexers 401 each receive four multiplexed inputs 304 from a corresponding set of four motherboards 300, and the quad multiplexers 401 each provide four-way multiplexed outputs 402 through corresponding matched-length coaxial cables to a second level N Y:1, e.g. quad 4:1 multiplexer 403, where Y is the number of first level multiplexers connected to a second level multiplexer. The multiplexer 403, in turn, provides a multiplexed N-channel (e.g. 4-channel) output 404 to a digitizing instrument e.g., four-channel oscilloscope 406 via a coaxial cable. The digitizing instrument 406 is configured to capture a slope of the amplified sense voltage signal VO as described further below in connection with FIGS. 6 and 7 in order for a processing unit to compute and provide an on-state impedance value (e.g., RDSON) for the individually measured DUTs 103. Although illustrated and described below including an oscilloscope 406, any suitable analysis system 406 can be used, which includes at least one analog-to-digital converter circuit and at least one processor to digitize and process received analog signals.

Figure 5:
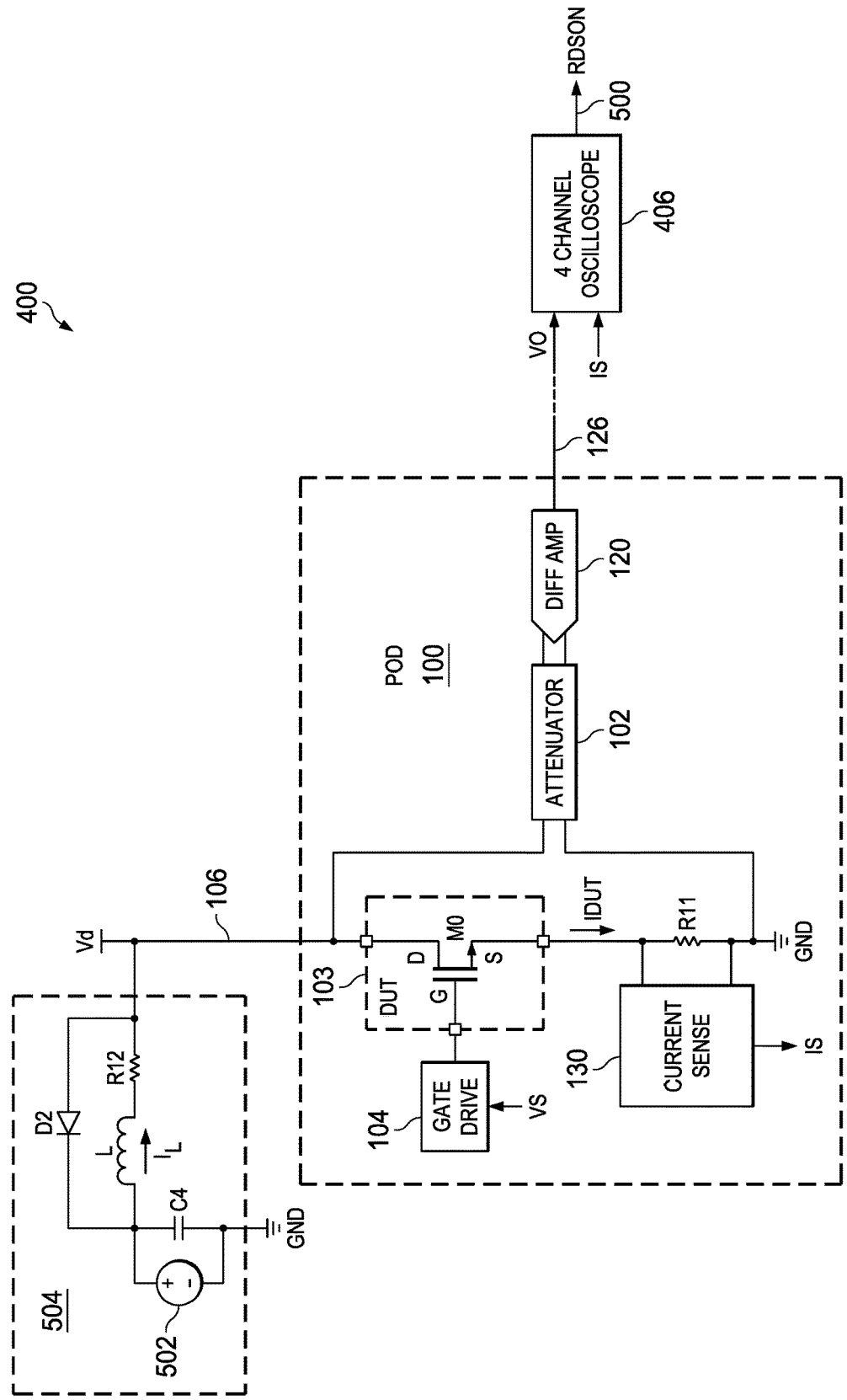
FIG. 5 is a simplified system diagram showing a high voltage transistor device under test (DUT) undergoing measurement of drain voltage and source current during switching in a high voltage subjecting circuit in the system of FIG. 4.

FIG. 5 shows a high voltage transistor DUT 103 (M0) undergoing measurement of drain voltage and source current during switching in a high voltage test circuit 504 in the system 400 of FIG. 4. In this example, the high-voltage test circuit 504 is a hard switching subjecting circuit including a high voltage DC supply or power source 504 (e.g., 400-600 V in one example) with a capacitance C4 and a load inductance L connected in series with a resistor R12 (e.g., 0.1 to 5 ohms) between the positive (+) output of the source 502 and the drain line 106 (Vd) of the DUT 103. The high-voltage circuit 504 further includes a second diode D2 with an anode connected to the line 106 and a cathode connected to the positive (+) output of the source 502. Other subjecting circuits may also be used, for example, a soft-switching subjecting circuit. In this example, the corresponding gate driver circuit 104 of the pod drives the DUT gate terminal in order to selectively turn M0 on and off to alternately conduct and block current from the high voltage supply 502. In the illustrated configuration, a low switching control signal turns on the DUT 103 (M0), allowing buildup or increase in an inductor current $I_L$ flowing in the inductor L. The attenuator circuit 102 and the differential amplifier circuit 120 measure the drain voltage of the DUT 103 to provide the sense voltage signal VO when the transistor M0 is on. Similarly, the current sense circuit 130 provides the current sense signal IS to represent the DUT current IDUT flowing from the source of M0 through the current sense resistor R11 when the transistor M0 is turned on. The oscilloscope 406 (or other digitizing instrument) receives the Vd and IS signals (e.g., through one or more multiplexers as described above) and processes these signals to provide an output signal or value 500 representing the RDSON of the tested DUT transistor M0. The Vd and IS signals in one example are processed for a given DUT 103 using a computer connected to the oscilloscope or another digitizing instrument to analyze the digital samples of the received analog signals, and perform curve fitting as needed, along with slope determination in order to compute or estimate RDSON for the DUT 103.

Figure 6:
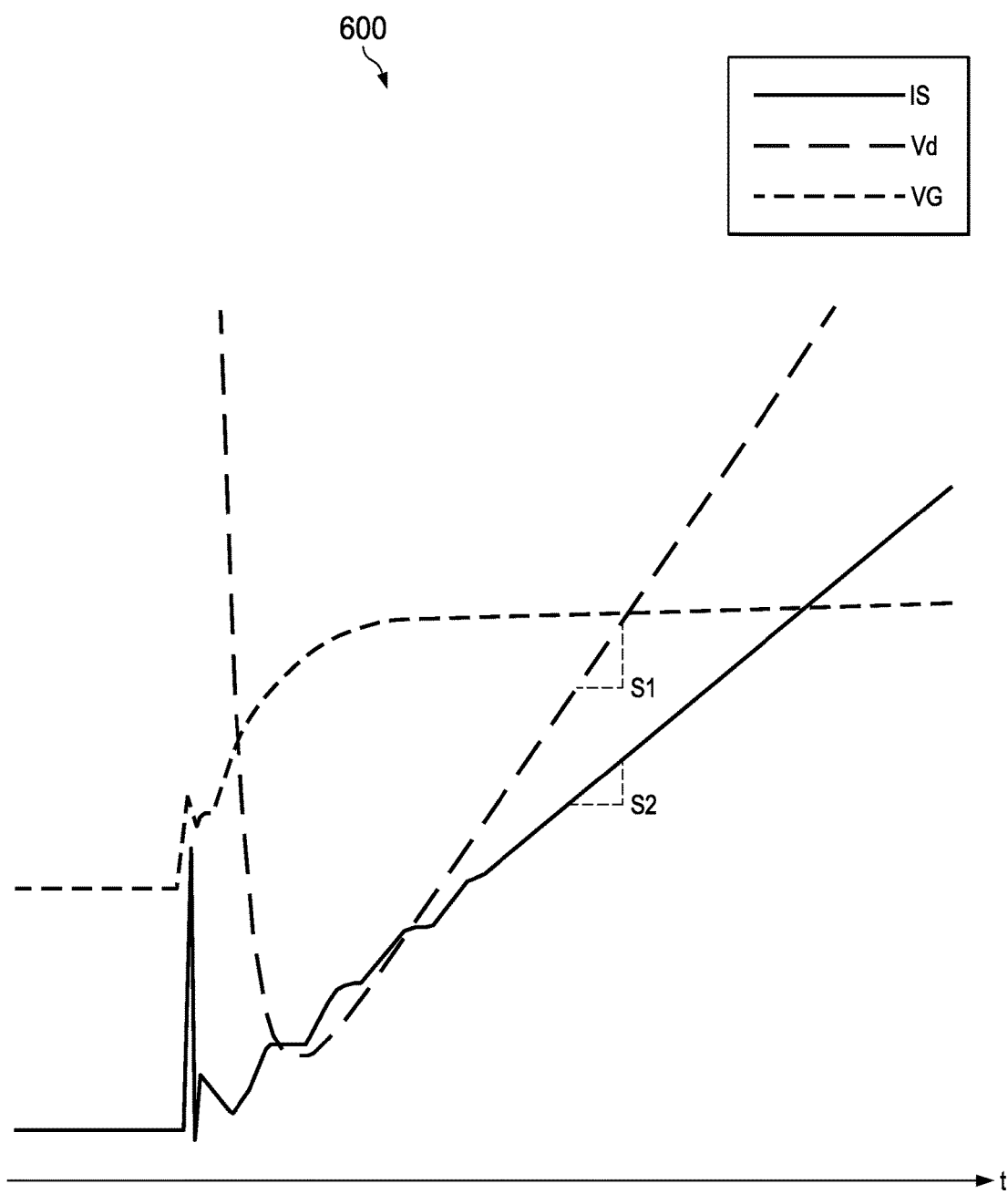
FIG. 6 is a graph showing gate voltage, drain voltage and source current waveforms for analyzing drain-source on resistance using voltage and current slope analysis for a high voltage transistor device under test in the system of FIG. 4.
Figure 7:
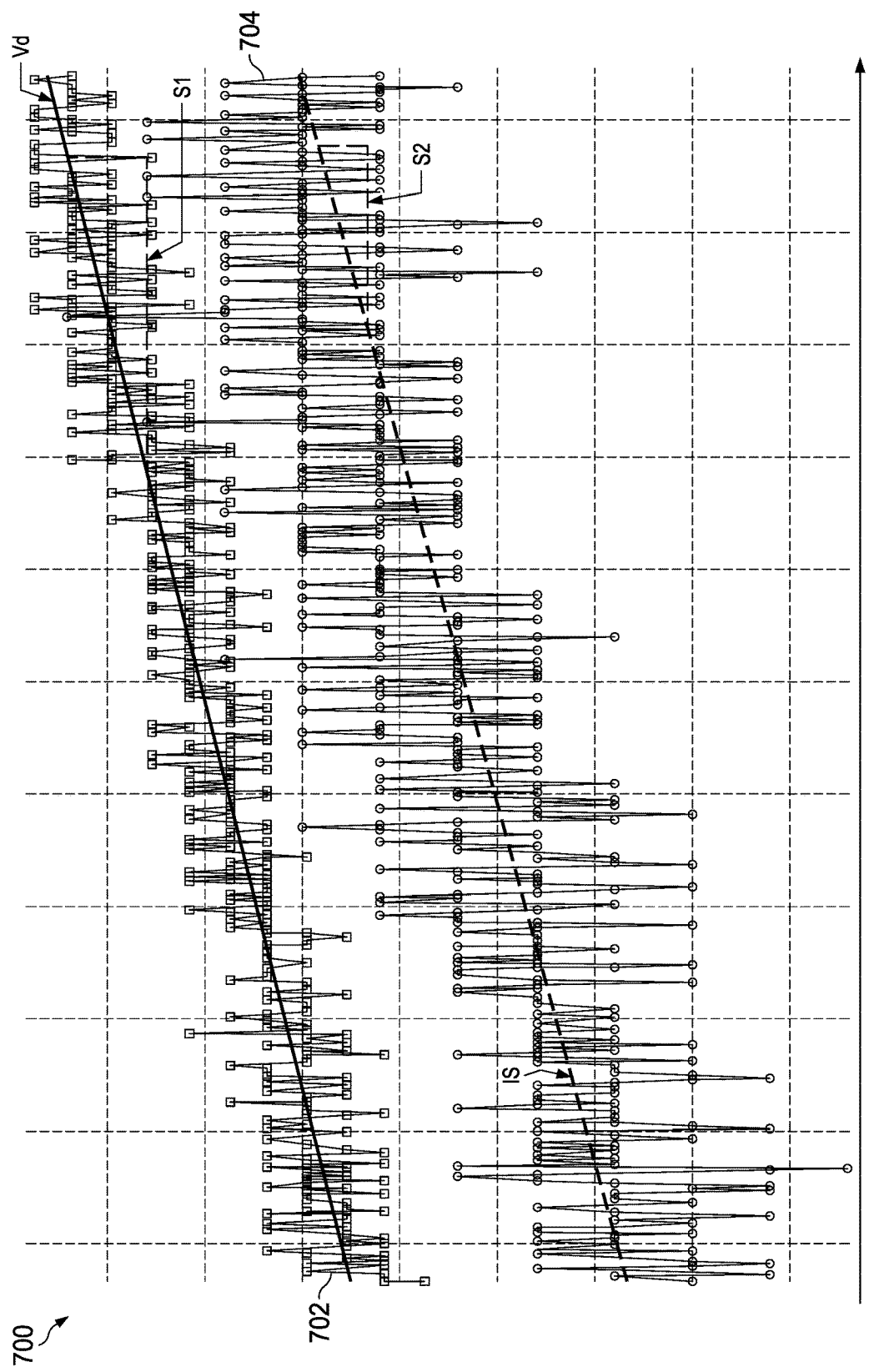
FIG. 7 is a graph showing oversampling and linear curve fitting for drain voltage and source current data in the system of FIG. 4.

Referring also to FIGS. 6 and 7, FIG. 6 provides a graph 600 illustrating a gate voltage curve or signal voltage waveform VS used to drive the DUT gate, a drain voltage curve Vd and a source current curve IS used by the oscilloscope 406 to analyze drain source on resistance RDSON using voltage and current slope analysis in the system of FIG. 4. Although described herein as having an oscilloscope 406 to perform various signal analysis functions, any suitable computer or processor-based analytical system can be used. In the illustrated example, a first slope S1 is determined by the computer or other data processing device which corresponds to the slope of the Vd signal, and a second slope S2 is determined which corresponds to the slope of the IS signal during the time when the VS signal is high indicating that the high-voltage transistor DUT M0 is on. In this regard, the drain-source voltage represented by the Vd signal and the source current represented by the IS signal ramp as the inductor L in the high-voltage circuit 500 charges in response to M0 turning on. The data processing device 406 determines the first and second slopes S1 and S2 and computes RDSON as (S1/S2)−R11 (FIGS. 1 and 2). In other implementations where a differential measurement is obtained across the drain and source of the DUT M0 103, subtraction of the value of the sense resistor R11 is not needed. The use of the slopes or ramps S1 and S2 in the computation of RDSON provides immunity against DC offset errors in the attenuation and amplifier circuits 102 and 120.

FIG. 7 provides a graph 700 showing samples obtained from an analog-to-digital (A/D) converter of the oscilloscope 406 in the system 400 of FIGS. 4 and 5, including a series of samples 702 related to the Vd signal and a series of samples 704 associated with the IS signal. In order to more accurately assess the actual slopes of the corresponding DUT drain-source voltage and source current, the data processing device 406 in one example is configured, rather than sampling a single measurement, to instead sample the signal over a configurable period of time and perform linear curve fitting to apply a linear curve in post-processing to determine a curve fit Vd from the samples 702, and to determine the corresponding first slope S1 from the fitted curve Vd. Likewise, curve fitting is also applied to the current sample 704 to determine a curve IS and determines the second slope S2 from the fitted curve IS in FIG. 7. The act of curve-fitting enables both noise reduction due to the averaging of multiple samples, and also an increase in the effective number of bits of the A/D converter of the data processing device 406, due to the fitting over multiple digital quantization units of the converter.

Figure 8:
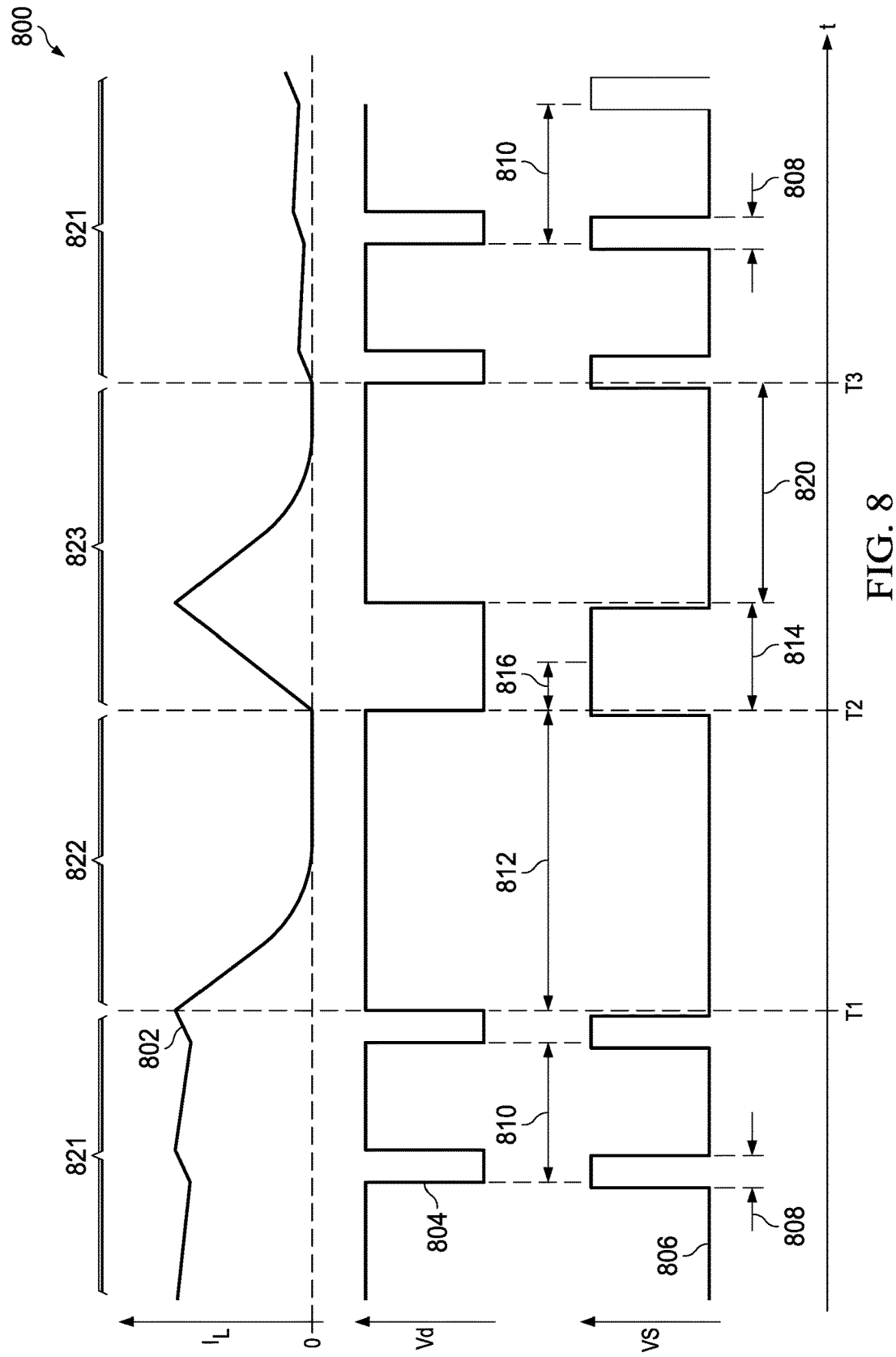
FIG. 8 is a graph showing signal waveforms in the system of FIG. 5.

FIG. 8 provides a graph 800 of signal waveforms in the system of FIG. 5, including an inductor current waveform 802 representing the current $I_L$ flowing in the inductor L of the test circuit 504, as well as a curve 804 representing the drain voltage 106, Vd of transistor M0 (103). A curve 806 in FIG. 8 represents the switching control signal (VS) provided to the drive circuit 104 that drives the gate control terminal of the DUT 103 (M0). In one example, the drive circuit 104 provides the switching control signal to the gate of M0 as a first sequence of short pulses indicated at 821 in FIG. 8 to stress the high voltage transistor M0, for example, to implement life testing or other test operation to simulate normal switching operation of the DUT 103 in a switched power converter test circuit 504 without wasting energy and minimizing ripple in the inductor current. The first sequence of pulses 804 may be performed for any suitable duration, with a sufficient number of switching pulses to ensure that the DUT 103 as operating at typical end-use current, temperature and voltage conditions. In one non-limiting example, the first set of pulses during the first sequence 821 have a short on-time duration 808, such as about 250 ns, and the first sequence of short pulses are provided at a switching period of approximately 45 µs corresponding to a switching frequency of approximately 22 kHz. The first sequence 821 is followed by a second sequence 822 in which the drive circuit 104 provides the switching control signal in a low state to turn the high voltage transistor M0 off. In one example, the second sequence 822 is a few milliseconds long, allowing the inductor current $I_L$ (e.g., curve 802 in FIG. 8) to decrease to a predetermined value, such as zero in the illustrated example. Allowing full or at least partial discharge of the inductor L facilitates use of a longer on-time pulse duration 814 to turn the high voltage transistor M0 on in a subsequent third sequence 823 to obtain the current sense signal IS and the amplified sense voltage signal VO, and to allow the analysis system 406 to compute the on-state impedance value RDSON of the high voltage transistor M0. Discharging the inductor to a predetermined value also allows the RDSON measurement to be repeatable for different stress currents. In particular, the on-time duration in the third sequence 823 in one example is greater than a duration 816 of approximately 1 µs or more during which the attenuator circuit 102 and the differential amplifier circuit 124 described above measure and provide the amplified sense voltage signal Vd, including any suitable settling time of the circuits 102, 124.

In one example, the drive circuit 104 is configured to provide the switching control signal to the DUT 103 such that the first sequence 821 of short pulses individually have a first on-time 808 that is less than the on-time 814 of the third sequence 823. In this manner, the first sequence of short pulses 821 facilitates simulated operation of the DUT 103 in a switching power converter with the inductor current 802 representing real-life switching converter conditions, while also minimizing both inductor current ripple and energy usage, while the second sequence 822 facilitates full or partial discharge of the inductor L for a duration 812 of a few milliseconds to reduce the inductor current level $I_L$, and the subsequent third sequence 823 thereafter provides the test pulse to turn on M0 for the on-time duration 814 to allow sufficient measurement time to measure the drain voltage of the DUT 103 while the inductor current is sufficiently low to mitigate the possibility to overstress the DUT 103 during on-state impedance measurement and for the RDSON measurement to be taken in the FET linear region (saturation region for BJT). In addition, for the duration 812 of the second sequence 822, the transistor is held under high voltage so that interface or bulk traps of the DUT 103 remain charged, and the RDSON value is measured during the measurement pulse during the time period 816 in FIG. 8 so that the determined RDSON reflects the presence of charged traps in the DUT 103. Thereafter, as seen in FIG. 8, the drive circuit 104 resumes switching operation in the first sequence 821 as previously described. In one example, the third sequence 823 allows a sufficient time 820 in order for the inductor current $I_L$ to again ramp down to zero or some other determine value, before the next sequence 821 of short pulses begins. As seen in FIG. 8, the inductor current curve 802 again begins to ramp up with successive charging and discharging cycles through the resumed switching operation of the DUT 103, and the next instance of the second and third sequences 822 and 823 in one example is repeated after the inductor current curve 802 has again resumed a normal operating level and sufficient stress time has elapsed to warrant a measurement. The illustrated test sequence can be implemented by individual gate drive circuits 104 of a plurality of the pods and motherboards 300, with a centralized controller (not shown) coordinating the switching test operation of the individual DUTs 103 and measurement of the corresponding drain voltages and transistor currents via the multiplexers 302, 401, 403 and matched-length cables such that a single analysis system (e.g., scope 406) can perform slope-based RDSON computations on converted analog signals from the individual motherboards 300.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A measurement circuit to measure a voltage of a drain terminal of a high voltage transistor during switching, the measurement circuit comprising:
   an attenuator circuit to generate an attenuator output signal representing a voltage across the high voltage transistor when the high voltage transistor is turned on, the attenuator circuit comprising:
   a clamp transistor having a first terminal coupled with the drain terminal of the high voltage transistor through a first resistor, a second terminal to provide a sense signal to a first internal node, and a control terminal,
   a bias circuit to provide a first bias signal to the control terminal based on a first supply voltage to turn the clamp transistor on when the high voltage transistor is turned on,
   a first voltage divider circuit, including an attenuator output node to provide the attenuator output signal based on the sense signal from the clamp transistor, a first divider resistor coupled between the first internal node and the attenuator output node, and a second divider resistor coupled between the attenuator output node and a constant voltage node, and
   a Zener diode coupled between the first internal node and the constant voltage node to limit a voltage between the first internal node and the constant voltage node when the high voltage transistor is turned off; and a differential amplifier, including a first input coupled with the attenuator output node to receive the attenuator output signal, a second input coupled with a reference voltage node, and an output to provide an amplified sense voltage signal representing the voltage across the high voltage transistor when the high voltage transistor is turned on.

2. The measurement circuit of claim 1, further comprising a clamp circuit to condition the attenuator output signal, the clamp circuit comprising:

a second voltage divider circuit, including a third divider resistor coupled between a second supply voltage and a second internal node, and a fourth divider resistor coupled between the second internal node and the constant voltage node; and a diode to limit a voltage of the attenuator output node, the diode including an anode coupled with the attenuator output node, and a cathode coupled with the second internal node.

3. The measurement circuit of claim 2, further comprising a compensation capacitor to compensate a capacitance of the first input of the differential amplifier, the compensation capacitor including a first terminal connected to the first internal node, and a second terminal connected to the attenuator output node.

4. The measurement circuit of claim 3, wherein the first divider resistor is adjustable.

5. The measurement circuit of claim 4, wherein the bias circuit includes a second resistor coupled between the first supply voltage and the control terminal of the clamp transistor, a third resistor coupled between the control terminal of the clamp transistor and the constant voltage node, and a bias circuit capacitor coupled between the control terminal of the clamp transistor and the constant voltage node to reduce voltage spikes on the control terminal of the clamp transistor during switching of the high voltage transistor.

6. The measurement circuit of claim 3, wherein the bias circuit includes a second resistor coupled between the first supply voltage and the control terminal of the clamp transistor, a third resistor coupled between the control terminal of the clamp transistor and the constant voltage node, and a bias circuit capacitor coupled between the control terminal of the clamp transistor and the constant voltage node to reduce voltage spikes on the control terminal of the clamp transistor during switching of the high voltage transistor.

7. The measurement circuit of claim 2, wherein the first divider resistor is adjustable.

8. The measurement circuit of claim 2, wherein the bias circuit includes a second resistor coupled between the first supply voltage and the control terminal of the clamp transistor, a third resistor coupled between the control terminal of the clamp transistor and the constant voltage node, and a bias circuit capacitor coupled between the control terminal of the clamp transistor and the constant voltage node to reduce voltage spikes on the control terminal of the clamp transistor during switching of the high voltage transistor.

9. The measurement circuit of claim 1, further comprising a compensation capacitor to compensate a capacitance of the first input of the differential amplifier, the compensation capacitor including a first terminal connected to the first internal node, and a second terminal connected to the attenuator output node.

10. The measurement circuit of claim 9, wherein the first divider resistor is adjustable.

11. The measurement circuit of claim 9, wherein the bias circuit includes a second resistor coupled between the first supply voltage and the control terminal of the clamp transistor, a third resistor coupled between the control terminal of the clamp transistor and the constant voltage node, and a bias circuit capacitor coupled between the control terminal of the clamp transistor and the constant voltage node to reduce voltage spikes on the control terminal of the clamp transistor during switching of the high voltage transistor.

12. The measurement circuit of claim 1, wherein the first divider resistor is adjustable.

13. The measurement circuit of claim 12, wherein the bias circuit includes a second resistor coupled between the first supply voltage and the control terminal of the clamp transistor, a third resistor coupled between the control terminal of the clamp transistor and the constant voltage node, and a bias circuit capacitor coupled between the control terminal of the clamp transistor and the constant voltage node to reduce voltage spikes on the control terminal of the clamp transistor during switching of the high voltage transistor.

14. The measurement circuit of claim 1, wherein the bias circuit includes a second resistor coupled between the first supply voltage and the control terminal of the clamp transistor, a third resistor coupled between the control terminal of the clamp transistor and the constant voltage node, and a bias circuit capacitor coupled between the control terminal of the clamp transistor and the constant voltage node to reduce voltage spikes on the control terminal of the clamp transistor during switching of the high voltage transistor.

15. A system to determine an on-state impedance of a high voltage transistor during switching, the system comprising:

a test circuit to receive the high voltage transistor;

a drive circuit to provide a switching control signal to a gate control terminal of the high voltage transistor to alternately conduct and block current from a high voltage supply in the test circuit;

a current sense circuit to provide a current sense signal representing a current flowing in the high voltage transistor;

an attenuator circuit to generate an attenuator output signal representing a voltage across the high voltage transistor when the high voltage transistor is turned on, the attenuator circuit comprising:

a clamp transistor having a first terminal coupled with a drain terminal of the high voltage transistor through a first resistor, a second terminal to provide a sense signal to a first internal node, and a control terminal, a bias circuit to provide a first bias signal to the control terminal based on a first supply voltage to turn the clamp transistor on when the high voltage transistor is turned on, a first voltage divider circuit, including an attenuator output node to provide the attenuator output signal based on the sense signal from the clamp transistor, a first divider resistor coupled between the first internal node and the attenuator output node, and a second divider resistor coupled between the attenuator output node and a constant voltage node, and a Zener diode coupled between the first internal node and the constant voltage node to limit a voltage between the first internal node and the constant voltage node when the high voltage transistor is turned off;

a differential amplifier, including a first input coupled with the attenuator output node to receive the attenuator output signal, a second input coupled with a reference voltage node, and an output to provide an amplified sense voltage signal representing the voltage across the high voltage transistor when the high voltage transistor is turned on; and an analysis system, including at least one processor to compute an on-state impedance value based on a slope of the current sense signal and a slope of the amplified sense voltage signal.

16. The system of claim 15, further comprising a clamp circuit to condition the attenuator output signal, the clamp circuit comprising:

a second voltage divider circuit, including a third divider resistor coupled between a second supply voltage and a second internal node, and a fourth divider resistor coupled between the second internal node and the constant voltage node; and a diode to limit a voltage of the attenuator output node, the diode including an anode coupled with the attenuator output node, and a cathode coupled with the second internal node.

17. The system of claim 15, further comprising a compensation capacitor to compensate a capacitance of the first input of the differential amplifier, the compensation capacitor including a first terminal connected to the first internal node, and a second terminal connected to the attenuator output node.

18. The system of claim 15, wherein the first divider resistor is adjustable.

19. The system of claim 15, wherein the bias circuit includes a second resistor coupled between the first supply voltage and the control terminal of the clamp transistor, a third resistor coupled between the control terminal of the clamp transistor and the constant voltage node, and a bias circuit capacitor coupled between the control terminal of the clamp transistor and the constant voltage node to reduce voltage spikes on the control terminal of the clamp transistor during switching of the high voltage transistor.

20. The system of claim 15, wherein the drive circuit is operative to provide the switching control signal to the gate control terminal of the high voltage transistor as a first sequence of short pulses to stress the high voltage transistor, followed by a second sequence to turn the high voltage transistor off to allow an inductor current of the test circuit to decrease to a predetermined value, and a third sequence following the second sequence to turn the high voltage transistor on to obtain the current sense signal and the amplified sense voltage signal to allow the analysis system to compute the on-state impedance value of the high voltage transistor.

21. The system of claim 20, wherein the drive circuit is operative to provide the switching control signal to provide the first sequence of short pulses individually having a first on-time, and wherein the drive circuit is operative to provide the switching control signal in the third sequence to turn the high voltage transistor on for a second on-time greater than the first on-time.

22. The system of claim 15, comprising:

wherein the test circuit comprises a plurality of test circuits individually operative to receive a corresponding one of a plurality of high voltage transistors;

wherein the drive circuit comprises a plurality of drive circuits individually operative to provide a switching control signal to a gate control terminal of a corresponding one of the plurality of high voltage transistors;

wherein the current sense circuit comprises a plurality of current sense circuits individually operative to provide a current sense signal representing a current flowing in a corresponding one of the plurality of high voltage transistors;

wherein the attenuator circuit comprises a plurality of attenuator circuits individually operative to generate an attenuator output signal representing a voltage across a corresponding one of the plurality of high voltage transistors when the corresponding one of the plurality of high voltage transistors is turned on, each of the individual attenuator circuits comprising:

a clamp transistor having a first terminal coupled with a drain terminal of the corresponding one of the plurality of high voltage transistors through a first resistor, a second terminal to provide a sense signal to a first internal node, and a control terminal, a bias circuit to provide a first bias signal to the control terminal based on a first supply voltage to turn the clamp transistor on when the corresponding one of the plurality of high voltage transistors is turned on, a first voltage divider circuit, including an attenuator output node to provide the attenuator output signal based on the sense signal from the clamp transistor, a first divider resistor coupled between the first internal node and the attenuator output node, and a second divider resistor coupled between the attenuator output node and a constant voltage node, and a Zener diode coupled between the first internal node and the constant voltage node to limit a voltage between the first internal node and the constant voltage node when the high voltage transistor is turned off; and wherein the differential amplifier comprises a plurality differential amplifiers individually associated with a corresponding one of the attenuator circuits, the individual differential amplifiers including a first input coupled with the corresponding attenuator output node to receive the corresponding attenuator output signal, a second input coupled with a reference voltage node, and an output to provide an amplified sense voltage signal representing the voltage across the corresponding one of the plurality of high voltage transistors when a corresponding one of the plurality of high voltage transistors is turned on; and at least one multiplexer circuit to receive signals from the differential amplifiers and from the current sense circuits, and to provide current sense signals and amplified sense voltage signals to the analysis system corresponding to the individual high voltage transistors;

wherein the analysis system is operative to receive the current sense signals and amplified sense voltage signals from the at least one multiplexer circuit, and to compute an on-state impedance value for the individual high voltage transistors based on a slope of a corresponding current sense signal and a slope of a corresponding amplified sense voltage signal.

23. A measurement circuit to measure a voltage of a drain terminal of a high voltage transistor during switching, the measurement circuit comprising:

an attenuator circuit to generate an attenuator output signal representing a voltage across the high voltage transistor when the high voltage transistor is turned on, the attenuator circuit comprising:

a clamp transistor having a first terminal coupled with the drain terminal of the high voltage transistor through a first resistor, a second terminal to provide a sense signal to a first internal node, and a control terminal, a bias circuit to provide a first bias signal to the control terminal based on a first supply voltage to turn the clamp transistor on when the high voltage transistor is turned on, a first voltage divider circuit, including an attenuator output node to provide the attenuator output signal based on the sense signal from the clamp transistor, a first divider resistor coupled between the first internal node and the attenuator output node, and a second divider resistor coupled between the attenuator output node and a constant voltage node, and a first clamp circuit to limit a voltage between the first internal node and the constant voltage node when the high voltage transistor is turned off;

a differential amplifier, including a first input coupled with the attenuator output node to receive the attenuator output signal, a second input coupled with a reference voltage node, and an output to provide an amplified sense voltage signal representing the voltage across the high voltage transistor when the high voltage transistor is turned on; and a second clamp circuit, including:

a second voltage divider circuit, including a third divider resistor coupled between a second supply voltage and a second internal node, and a fourth divider resistor coupled between the second internal node and the constant voltage node, and a diode to limit a voltage of the attenuator output node, the diode including an anode coupled with the attenuator output node, and a cathode coupled with the second internal node.

24. A method of determining an on-state impedance of a high voltage transistor, comprising:

using a first clamping circuit, which limits voltage applied to an attenuation circuit, and measuring a drain voltage of the high voltage transistor while the high voltage transistor is turned on;

clamping a voltage coupled to the attenuation circuit and to an input of an amplifier and limiting voltage applied to the input of the amplifier;

measuring a transistor current flowing through the high voltage transistor while the high voltage transistor is turned on, wherein the measuring of the drain voltage and the transistor current are performed without direct connection of an oscilloscope to a device under test;

digitizing a plurality of samples of the measured drain voltage of the high voltage transistor;

digitizing a plurality of samples of the measured transistor current;

using at least one processor, determining a first slope corresponding to the plurality of samples of the measured drain voltage;

using the at least one processor, determining a second slope corresponding to the plurality of samples of the measured transistor current; and using the at least one processor, computing an on-state impedance value at least partially according to the first and second slopes.

25. The method of claim 24, comprising:

using the at least one processor, determining the first slope by curve fitting the plurality of samples of the measured drain voltage; and using the at least one processor, determining the second slope by curve fitting the plurality of samples of the measured transistor current.

* * * * *